United States Patent
Harada et al.

(10) Patent No.: US 12,538,820 B2
(45) Date of Patent: Jan. 27, 2026

(54) SEMICONDUCTOR PACKAGE, SEMICONDUCTOR DEVICE, AND POWER CONVERSION DEVICE

(71) Applicant: Mitsubishi Electric Corporation, Tokyo (JP)

(72) Inventors: Kozo Harada, Tokyo (JP); Hodaka Rokubuichi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 552 days.

(21) Appl. No.: 18/020,634

(22) PCT Filed: Oct. 29, 2020

(86) PCT No.: PCT/JP2020/040606
§ 371 (c)(1),
(2) Date: Jul. 13, 2023

(87) PCT Pub. No.: WO2022/091288
PCT Pub. Date: May 5, 2022

(65) Prior Publication Data
US 2024/0055357 A1   Feb. 15, 2024

(51) Int. Cl.
*H01L 23/538* (2006.01)
*H01L 23/31* (2006.01)
(Continued)

(52) U.S. Cl.
CPC ...... *H01L 23/5386* (2013.01); *H01L 23/3121* (2013.01); *H01L 23/3672* (2013.01);
(Continued)

(58) Field of Classification Search
CPC ............. H01L 23/5386; H01L 23/3121; H01L 23/3672; H01L 23/3735; H01L 23/5383; H01L 24/32; H01L 2224/32245
See application file for complete search history.

(56) References Cited

U.S. PATENT DOCUMENTS

| 6,370,013 | B1 * | 4/2002 | Iino | H01L 23/642 |
| | | | | 361/309 |
| 2001/0010627 | A1 * | 8/2001 | Akagawa | H01L 24/97 |
| | | | | 361/764 |

(Continued)

FOREIGN PATENT DOCUMENTS

| JP | 11-204700 A | 7/1999 |
| JP | 2001-267458 A | 9/2001 |

(Continued)

OTHER PUBLICATIONS

Chinese Office Action issued Jan. 21, 2025, in corresponding Chinese Patent Application No. 202080106393.8, 18pp.

(Continued)

*Primary Examiner* — Peniel M Gumedzoe
(74) *Attorney, Agent, or Firm* — XSENSUS LLP

(57) ABSTRACT

A semiconductor package includes a semiconductor element, a first insulating layer, a first wiring layer, a second insulating layer, and a second wiring layer. The first insulating layer covers the semiconductor element. The first wiring layer includes a first layer section. The first layer section covers the first insulating layer. The second insulating layer covers the first insulating layer and the first wiring layer. The second wiring layer is electrically connected to the semiconductor element through a second through hole and a third through hole. The second wiring layer includes a second layer section. The second layer section covers the second insulating layer. The second layer section of the second wiring layer has a portion overlying the first layer section of the first wiring layer with the second insulating layer interposed.

14 Claims, 20 Drawing Sheets

(51) Int. Cl.
  *H01L 23/367*    (2006.01)
  *H01L 23/373*    (2006.01)
  *H01L 23/00*     (2006.01)

(52) U.S. Cl.
  CPC ...... *H01L 23/3735* (2013.01); *H01L 23/5383* (2013.01); *H01L 24/32* (2013.01); *H01L 2224/32245* (2013.01)

(56) References Cited

U.S. PATENT DOCUMENTS

| | | |
|---|---|---|
| 2011/0175213 A1 | 7/2011 | Mori et al. |
| 2014/0264800 A1 | 9/2014 | Gowda et al. |
| 2016/0255714 A1 | 9/2016 | Hiramitsu |

FOREIGN PATENT DOCUMENTS

| | | |
|---|---|---|
| JP | 2003031946 A | 1/2003 |
| JP | 2011-258594 A | 12/2011 |
| JP | 2014-179612 A | 9/2014 |
| JP | 2016-163372 A | 9/2016 |

OTHER PUBLICATIONS

International Search Report and Written Opinion mailed on Jan. 26, 2021, received for PCT Application PCT/JP2020/040606, filed on Oct. 29, 2020, 9 pages including English Translation.
Chinese Office Action issued Sep. 26, 2024, in Chinese Patent Application No. 202080106393.8, 20pp.

\* cited by examiner

SEMICONDUCTOR PACKAGE, SEMICONDUCTOR DEVICE, AND POWER CONVERSION DEVICE

CROSS-REFERENCE TO RELATED APPLICATION

The present application is based on PCT filing PCT/JP2020/040606, filed Oct. 29, 2020, the entire contents of which are incorporated herein by reference.

TECHNICAL FIELD

The present disclosure relates to a semiconductor package, a semiconductor device, and a power conversion device.

BACKGROUND ART

Conventionally, there are semiconductor elements called power semiconductor elements. Power semiconductor elements are semiconductor elements adapted for high voltage and large current. In some power semiconductor elements, a power feed path extends along the vertical direction of the power semiconductor element. A power semiconductor package having a power semiconductor element mounted on a circuit board and packaged by sealing resin is connected to a cooler called heat sink, a control component, and the like. The power semiconductor package connected to a heat sink is used as a semiconductor device in a variety of applications ranging from industrial equipment, automobiles, and railroads.

In recent years, with reduction in size and weight of equipment provided with semiconductor devices, there is a demand for reducing the size and weight of power semiconductor packages. For example, a semiconductor device module (semiconductor package) described in Japanese Patent Laying-Open No. 2014-179612 (PTL 1) includes a semiconductor device (semiconductor element), a dielectric layer (first insulating layer), and a metallization layer (first wiring layer). The semiconductor device module can be employed as a power semiconductor package. The dielectric layer is overlaid on the semiconductor device. The dielectric layer has a through hole overlapping the semiconductor device. The metallization layer is electrically connected to an electrode of the semiconductor device through the through hole. The wiring of the metallization layer is thereby led to the surface of the dielectric layer. The wiring of the metallization layer is therefore overlaid on the dielectric layer. This configuration enables size reduction of the semiconductor device module along the width direction.

The power semiconductor element of a power semiconductor package performs switching operation in high voltage and large current. When the power semiconductor element changes from the off state to the on state in the switching operation, a surge voltage is applied to the power semiconductor element. The magnitude of the surge voltage is proportional to the time rate of change of current and the inductance of the wiring of the power semiconductor package. When the surge voltage is large, the power semiconductor element may deteriorate. In the power semiconductor package, therefore, it is required to reduce the inductance together with size reduction.

CITATION LIST

Patent Literature

PTL 1: Japanese Patent Laying-Open No. 2014-179612

SUMMARY OF INVENTION

Technical Problem

However, in the semiconductor package (semiconductor device module) described in the above literature, when the wiring of the first wiring layer (metallization layer) is routed so as to ensure the insulation distance between adjacent wires, the wiring is complicated. When the wiring is complicated, it is difficult to consider the direction of current flowing through the adjacent wires, and therefore, current in the same direction may flow through the adjacent wires. Thus, the first wiring layer is affected by the magnetic flux caused by the current. It is therefore difficult to reduce the inductance of the semiconductor package.

The present disclosure is made in view of the above problem and an object of the present disclosure is to provide a semiconductor package with reduced inductance, a semiconductor device, and a power conversion device.

Solution to Problem

A semiconductor package according to the present disclosure includes a semiconductor element, a first insulating layer, a first wiring layer, a second insulating layer, and a second wiring layer. The first insulating layer covers the semiconductor element. The first insulating layer has a first through hole and a second through hole. The first wiring layer includes a first layer section. The first layer section covers the first insulating layer. The first wiring layer is electrically connected to the semiconductor element through the first through hole. The second insulating layer covers the first insulating layer and the first wiring layer. The second insulating layer has a third through hole. The third through hole is communicatively connected to the second through hole. The second wiring layer is electrically connected to the semiconductor element through the second through hole and the third through hole. The second wiring layer includes a second layer section. The second layer section covers the second insulating layer. The second layer section of the second wiring layer has a portion overlying the first layer section of the first wiring layer with the second insulating layer interposed.

Advantageous Effects of Invention

In the semiconductor package according to the present disclosure, the second layer section of the second wiring layer has a portion overlying the first layer section of the first wiring layer. With this configuration, the direction of current flowing through the portion of the second layer section overlying the first layer section of the first wiring layer can be opposite to the direction of current flowing through the first layer section. Thus, the influences of magnetic fluxes by the current flowing through the first layer section and the current flowing through the second layer section can cancel each other out. Accordingly, the inductance of the semiconductor package can be reduced.

DESCRIPTION OF EMBODIMENTS

Embodiments will be described below based on the drawings. In the following, the same or corresponding parts are denoted by the same reference signs and an overlapping description will not be repeated.

First Embodiment

Figure 1:
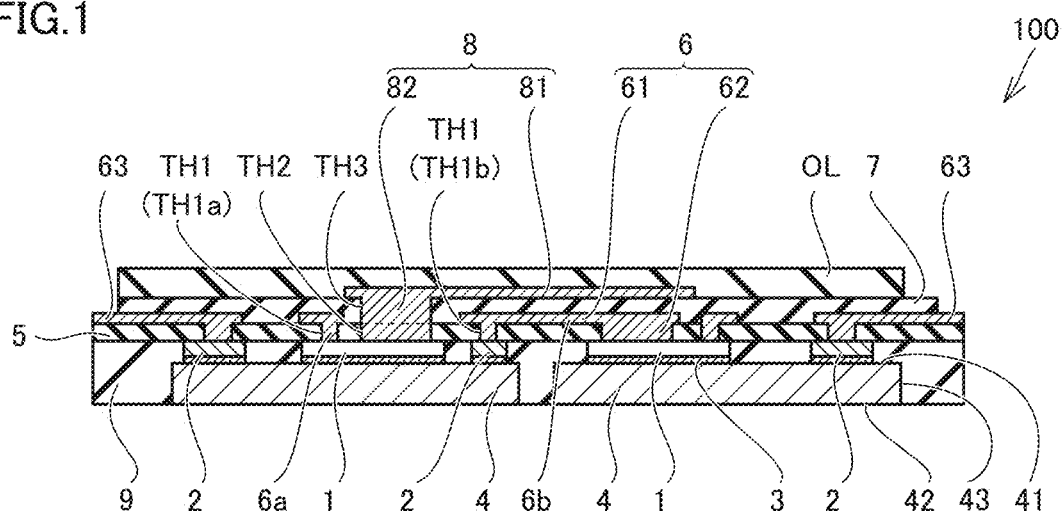
FIG. 1 is a cross-sectional view schematically showing a configuration of a semiconductor package according to a first embodiment.

Referring to FIG. 1 to FIG. 5, a configuration of a semiconductor package 100 according to a first embodiment will be described. FIG. 1 is a cross-sectional view taken along line I-I in FIG. 2. As shown in FIG. 1, semiconductor package 100 includes a semiconductor element 1, a first insulating layer 5, a first wiring layer 6, a second insulating layer 7, and a second wiring layer 8. Semiconductor package 100 according to the present embodiment further includes a conductive plate 2, a bonding material 3, a heat spreader 4, a sealing section 9, and an organic layer OL. Semiconductor package 100 is a power semiconductor package. The power semiconductor package is semiconductor package 100 including a power semiconductor element described later.

Semiconductor element 1 according to the present embodiment is a power semiconductor element. In the present embodiment, the power semiconductor element is a semiconductor element for handling high voltage or large current. The power semiconductor element is, for example, a semiconductor element for electric power. Specifically, the power semiconductor element is a semiconductor element for power control, such as a metal oxide semiconductor field effect transistor (MOSFET) and an insulated gate bipolar transistor (IGBT), a freewheeling diode, or the like.

Semiconductor element 1 according to the present embodiment is a vertical semiconductor element. Thus, current flows in the direction from a front surface to a back surface of semiconductor element 1. The front surface of semiconductor element 1 is formed as an electrode.

Semiconductor element 1 is bonded to heat spreader 4 by bonding material 3. Bonding material 3 is, for example, solder, sintered silver (Ag), and a conductive adhesive. The bonding between semiconductor element 1 and heat spreader 4 is not limited to that using bonding material 3. Semiconductor element 1 may be bonded to heat spreader 4, for example, by liquid-phase diffusion bonding.

Conductive plate 2 is bonded to heat spreader 4 by bonding material 3. Thus, current passing through semiconductor element 1 and heat spreader 4 is led to first wiring layer 6 by conductive plate 2. The material of conductive plate 2 is a metal having conductivity. The material of conductive plate 2 is, for example, copper (Cu) and aluminum (Al). The thickness of conductive plate 2 is approximately the same as that of semiconductor element 1. The bonding between conductive plate 2 and heat spreader 4 is not limited to that using bonding material 3. Conductive plate 2 may be bonded to heat spreader 4, for example, by liquid-phase diffusion bonding.

Heat spreader 4 has a first surface 41, a second surface 42, and a side surface 43. Semiconductor element 1 and conductive plate 2 are bonded to first surface 41. Second surface 42 is opposed to first surface 41. Side surface 43 connects first surface 41 and second surface 42. The material of heat spreader 4 is, for example, a metal with excellent heat dissipation, such as copper (Cu) and aluminum (Al).

First insulating layer 5 covers semiconductor element 1. First insulating layer 5 covers conductive plate 2. First insulating layer 5 is, for example, a polymer insulating film formed of a polymer material such as liquid crystal polymer and polyimide. First insulating layer 5 is attached to the respective surfaces of semiconductor element 1 and conductive plate 2 by, for example, a not-shown resin adhesive.

First insulating layer 5 has a first through hole TH1 and second through hole TH2. First through hole TH1 and second through hole TH2 penetrate first insulating layer 5. First through hole TH1 and second through hole TH2 are formed as vias. In first insulating layer 5, first through hole TH1 and second through hole TH2 are formed, for example, by laser processing. First through hole TH1 includes a first through portion TH1a and a second through portion TH1b. First through portion TH1a overlaps semiconductor element 1. Second through portion TH1b overlaps conductive plate 2. Second through hole TH2 overlaps semiconductor element 1.

First wiring layer 6 is electrically connected to semiconductor element 1 through first through hole TH1. First wiring layer 6 is formed as a metal wiring layer. First wiring layer 6 is formed by patterning.

First wiring layer 6 is formed by the following process. After first insulating layer 5 is attached to semiconductor element 1 and conductive plate 2, first through hole TH1 and second through hole TH2 are formed in first insulating layer 5. Subsequently, a metal sputtering film was deposited on first insulating layer 5. The metal sputtering film is also deposited in first through hole TH1 and second through hole TH2. Plating is then formed on the metal sputtering film. After plating is grown so that the plating has a sufficient thickness, the metal sputtering film and the plating undergo etching. A wiring pattern of first wiring layer 6 is thus formed. The method of forming the wiring pattern of first wiring layer 6 is not limited to the method above. For example, the wiring pattern of first wiring layer 6 may be formed by attaching a metal foil on first insulating layer 5 and then etching the metal foil.

First wiring layer 6 includes a first layer section 61, a first connection section 62, and a first terminal section 63. First layer section 61 covers first insulating layer 5. First layer section 61 is electrically connected to semiconductor element 1 by first connection section 62. First layer section 61 has a flat plate shape. First connection section 62 is arranged inside first through hole TH1. First terminal section 63 is exposed from second insulating layer 7. First terminal section 63 is therefore formed as a terminal for connecting to external wiring.

First wiring layer 6 includes a first wiring portion 6a and a second wiring portion 6b. In the present embodiment, first wiring layer 6 includes a plurality of first wiring portions 6a as described later. First wiring portion 6a is electrically connected to semiconductor element 1 through first through portion TH1a. Second wiring portion 6b is electrically connected to conductive plate 2 through second through portion TH1b. In FIG. 1, first layer section 61 is included in second wiring portion 6b. First wiring portion 6a and second wiring portion 6b are connected by semiconductor element 1, conductive plate 2, and heat spreader 4.

Second insulating layer 7 covers first insulating layer 5 and first wiring layer 6. Second insulating layer 7 has a third through hole TH3. Third through hole TH3 penetrates second insulating layer 7. Third through hole TH3 is formed as a via. Third through hole TH3 is communicatively connected to second through hole TH2.

Second insulating layer 7 is, for example, a polymer insulating film formed of a polymer material such as liquid crystal polymer and polyimide. Second insulating layer 7 is attached to the respective surfaces of first insulating layer 5 and first wiring layer 6 by, for example, a not-shown resin adhesive.

Second wiring layer 8 is electrically connected to semiconductor element 1 through second through hole TH2 and third through hole TH3. Second wiring layer 8 is formed by the same method as in first wiring layer 6. Second wiring layer 8 therefore has a wiring pattern formed by etching. In the present embodiment, for example, first wiring layer 6 is formed as a P terminal, and second wiring layer 8 is formed as an N terminal.

Figure 2:
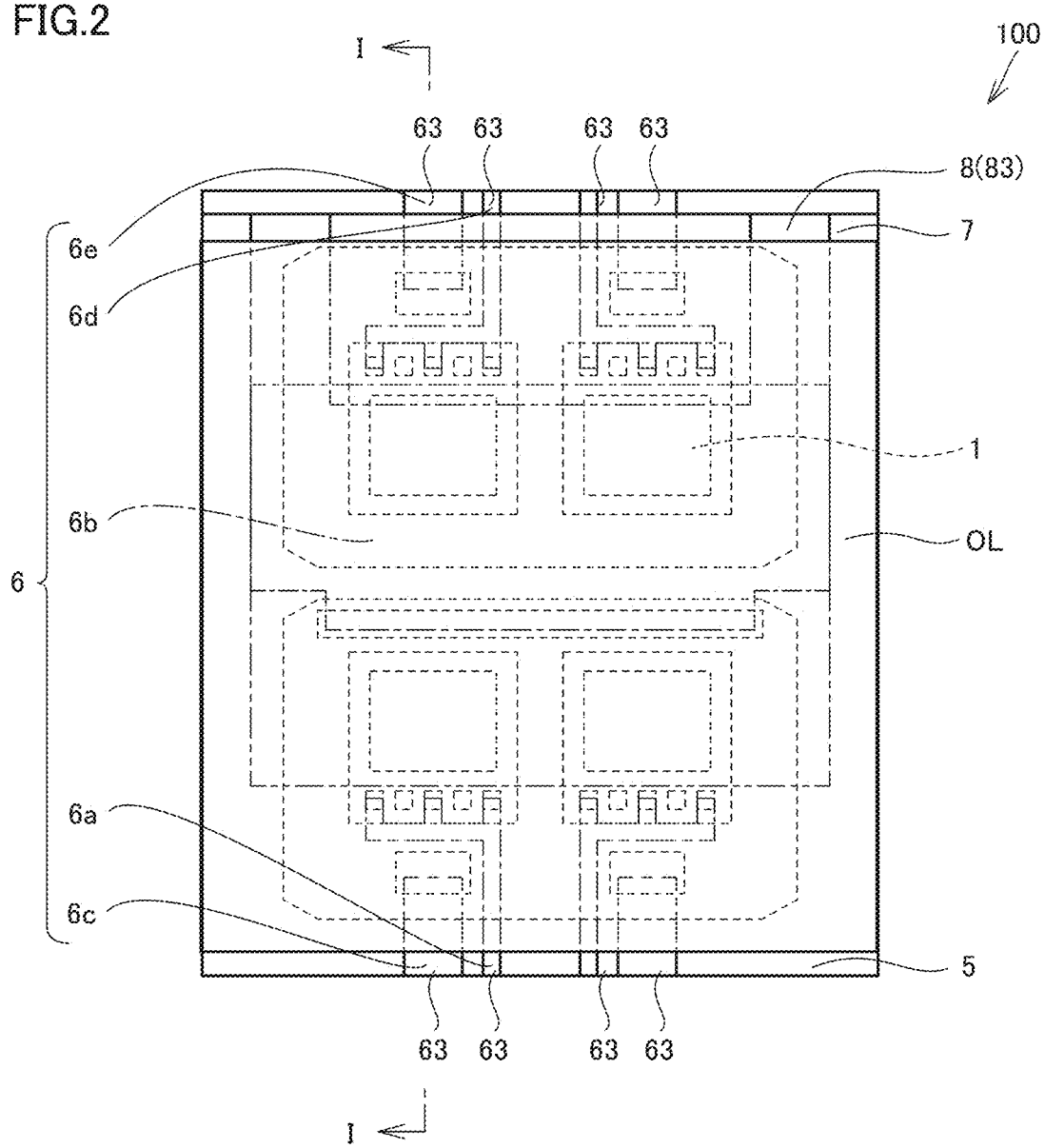
FIG. 2 is a top view schematically showing a configuration of the semiconductor package according to the first embodiment.

Second wiring layer 8 includes a second layer section 81, a second connection section 82, and a second terminal section 83 (see FIG. 2). Second layer section 81 covers second insulating layer 7. Second layer section 81 has a flat plate shape. Second layer section 81 is overlaid in parallel to first layer section 61. That is, first layer section 61 and second layer section 81 are formed as parallel flat plates. Second layer section 81 is electrically connected to semiconductor element 1 by second connection section 82. Second connection section 82 is arranged inside second through hole TH2 and third through hole TH3. The configuration of second terminal section 83 will be described later.

Second layer section 81 of second wiring layer 8 has a portion overlying first layer section 61 of first wiring layer 6 with second insulating layer 7 interposed. Second wiring layer 8 is formed such that current in a direction opposite to current flowing through first layer section 61 flows through the portion of second layer section 81 overlying first layer section 61 with second insulating layer 7 interposed.

Sealing section 9 seals semiconductor element 1 and conductive plate 2 between first surface 41 and first insulating layer 5. Sealing section 9 seals first surface 41 and side surface 43 of heat spreader 4. A surface of semiconductor element 1, a surface of conductive plate 2, and second surface 42 of heat spreader 4 are exposed from sealing section 9. The material of sealing section 9 is, for example, epoxy resin. Sealing section 9 is formed by, for example, transfer molding using a mold.

Organic layer OL overlies second wiring layer 8. The material of organic layer OL is, for example, resist. Organic layer OL is formed by, for example, applying resist on a surface of second wiring layer 8. The surface of second wiring layer 8 is protected by organic layer OL.

As shown in FIG. 2, first wiring layer 6 and second wiring layer 8 are partially exposed from organic layer OL. In FIG. 2, the outer shapes of the portions of semiconductor element 1, conductive plate 2, and heat spreader 4 on which other members are overlaid are shown by broken lines. The outer shapes of the portions of first insulating layer 5 and first wiring layer 6 on which other members are overlaid are shown by dashed-dotted lines. The outer shapes of the portions of second insulating layer 7 and second wiring layer 8 on which other members are overlaid are shown by dashed-two dotted lines. First wiring layer 6 and second wiring layer 8 are exposed from the outer periphery of organic layer OL. Second terminal section 83 of second wiring layer 8 is exposed from organic layer OL. Second terminal section 83 is therefore formed as a terminal for connecting to the outside.

Although not shown in the drawings, semiconductor package 100 may further include a third insulating layer and a third wiring layer. The third insulating layer covers second insulating layer 7 and second wiring layer 8. The third wiring layer is electrically connected to second wiring layer 8. The third wiring layer includes a third layer section. The third layer section covers second wiring layer 8. The third layer section has a portion overlying second layer section 81 of second wiring layer 8 with the third insulating layer interposed. Organic layer OL may cover the third wiring layer.

Figure 3:
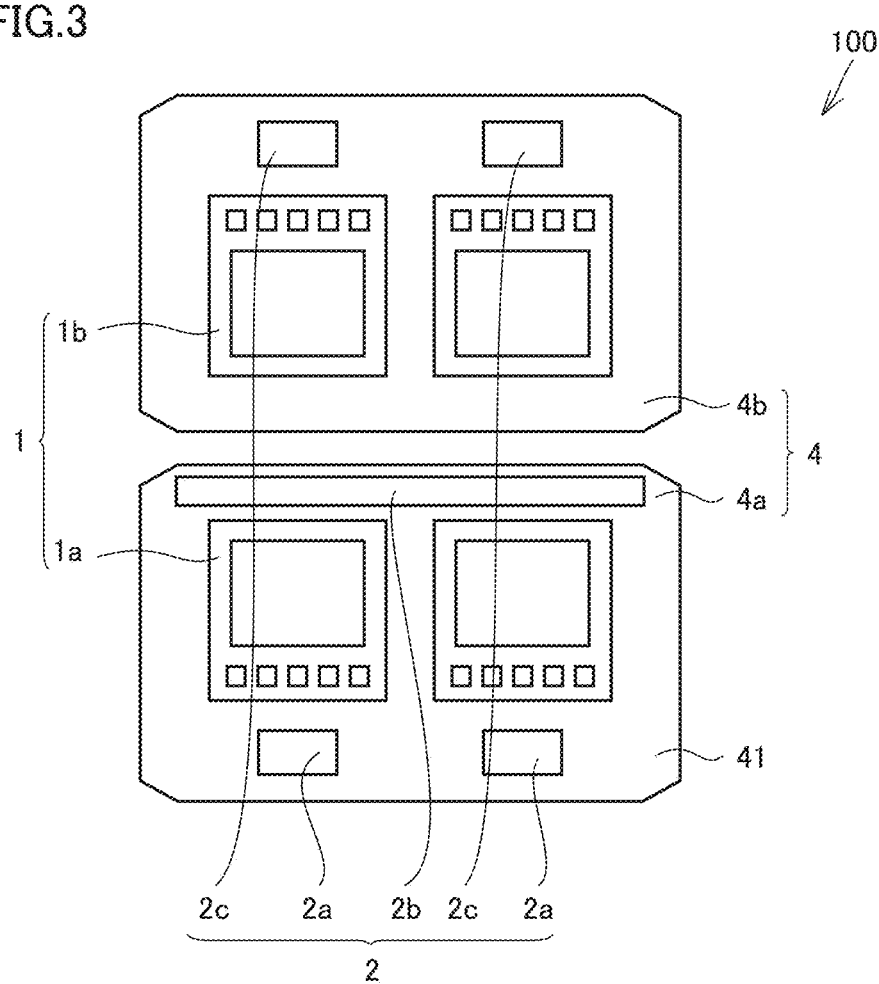
FIG. 3 is a top view schematically showing a configuration of a semiconductor element, a conductive plate, and a heat spreader in the semiconductor package according to the first embodiment.
Figure 4:
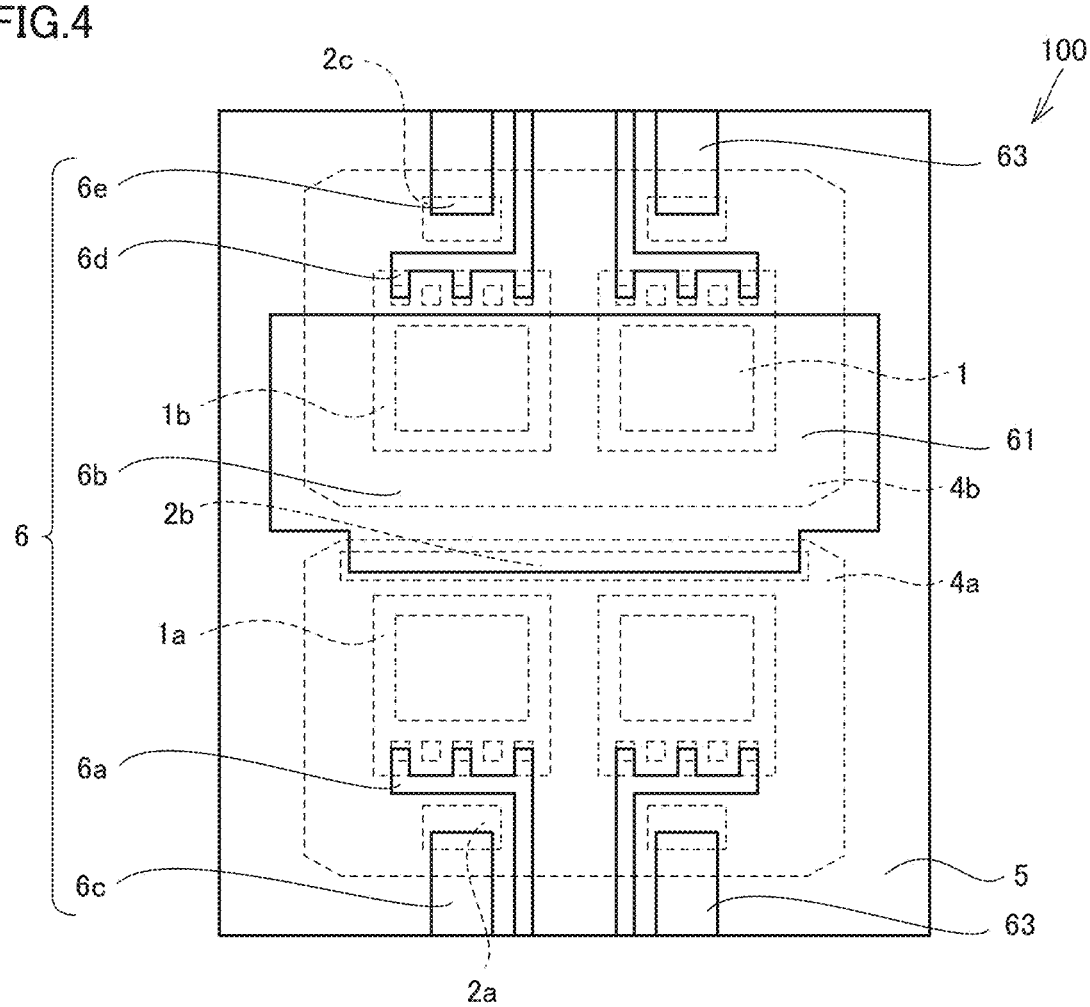
FIG. 4 is a top view schematically showing a configuration of the semiconductor element, the conductive plate, the heat spreader, a first insulating layer, and a first wiring layer in the semiconductor package according to the first embodiment.
Figure 5:
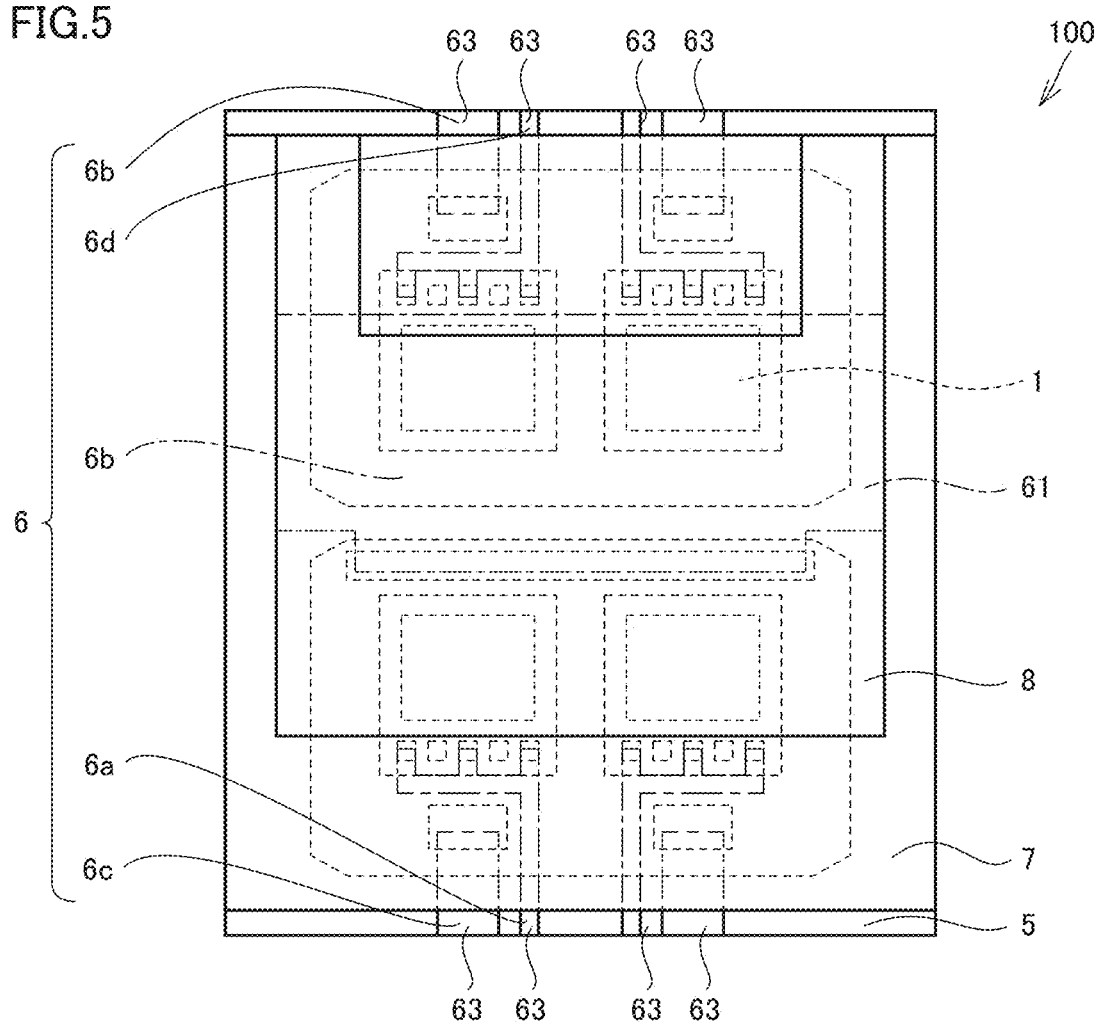
FIG. 5 is a top view schematically showing a configuration of the semiconductor element, the conductive plate, the heat spreader, the first insulating layer, the first wiring layer, a second insulating layer, and a second wiring layer in the semiconductor package according to the first embodiment.

Referring now to FIG. 3 to FIG. 5, semiconductor package 100 according to the first embodiment will be described in detail.

As shown in FIG. 3, semiconductor element 1 includes a plurality of first semiconductor sections 1*a* and a plurality of second semiconductor sections 1*b*. In FIG. 3, sealing section 9 is not shown for convenience of explanation.

Conductive plate 2 includes a plurality of first conductive sections 2*a*, a second conductive section 2*b*, and a plurality of third conductive sections 2*c*. Second conductive section 2*b* is arranged between first semiconductor sections 1*a* and second semiconductor sections 1*b*. A plurality of third conductive sections 2*c* are arranged on a side opposite to first semiconductor sections 1*a* with respect to second conductive section 2*b*.

Heat spreader 4 includes a first heat spreader section 4*a* and a second heat spreader section 4*b*. First heat spreader section 4*a* is arranged at a distance from first heat spreader section 4*a*. A plurality of first semiconductor sections 1*a*, a plurality of first conductive sections 2*a*, and second conductive section 2*b* are bonded to first heat spreader section 4*a*. A plurality of second semiconductor sections 1*b* and a plurality of third conductive sections 2*c* are bonded to second heat spreader section 4*b*.

As shown in FIG. 4, first wiring layer 6 includes a plurality of first wiring portions 6*a*, second wiring portion 6*b*, a plurality of third wiring portions 6*c*, a plurality of fourth wiring portion 6*d*, and a plurality of fifth wiring portions 6*e*. In FIG. 4, the outer shapes of the portions of semiconductor element 1, conductive plate 2, and heat spreader 4 on which other members are overlaid are shown by broken lines. Each of a plurality of first wiring portions 6*a* is connected to the corresponding one of a plurality of first semiconductor sections 1*a*. Second wiring portion 6*b* is bonded to second conductive section 2*b* and each of a plurality of second semiconductor sections 1*b*. Each of a plurality of third wiring portions 6*c* is connected to the corresponding one of a plurality of first conductive sections 2*a*. Each of a plurality of fourth wiring portions 6*d* is connected to the corresponding one of a plurality of second semiconductor sections 1*b*. Each of a plurality of fifth wiring portions 6*e* is connected to the corresponding one of a plurality of third conductive sections 2*c*.

First wiring layer 6 has an area equal to or larger than semiconductor element 1. Specifically, second wiring portion 6*b* has an area equal to or larger than that of semiconductor element 1. First layer section 61 has an area equal to or larger than that of semiconductor element 1.

As shown in FIG. 5, each of a plurality of first wiring portions 6*a*, a plurality of third wiring portions 6*c*, a plurality of fourth wiring portions 6*d*, and a plurality of fifth wiring portions 6*e* is partially exposed from second insulating layer 7. In FIG. 5, the outer shapes of the portions of first insulating layer 5 and first wiring layer 6 on which other members are overlaid are shown by dashed-dotted lines. Each of a plurality of first wiring portions 6*a*, a plurality of second wiring portions 6*b*, a plurality of fourth wiring portions 6*d*, and a plurality of fifth wiring portions 6*e* is connectable to an external terminal. Each of a plurality of first wiring portions 6*a*, a plurality of third wiring portions 6*c*, a plurality of fourth wiring portions 6*d*, and a plurality of fifth wiring portions 6*e* includes first terminal section 63. Second wiring portion 6*b* is covered with second insulating layer 7. Second wiring layer 8 overlaps second wiring portion 6*b*. Second wiring layer 8 has an area equal to or larger than that of semiconductor element 1.

Current flowing through semiconductor package 100 according to the first embodiment will now be described.

Semiconductor package 100 according to the present embodiment performs switching operation at large current and high voltage. As shown in FIG. 1, when semiconductor element 1 changes from the on state to the off state in the switching operation, a surge voltage ΔV is applied to semiconductor element 1. Surge voltage ΔV is calculated based on the time rate of change di/dt of current when semiconductor element 1 changes from the on state to the off state, and inductance L of wiring included in semiconductor device 200. Specifically, surge voltage ΔV is expressed by the following equation.

$$\Delta V = L \cdot di/dt$$

When inductance L and the time rate of change di/dt of current are large, a surge voltage ΔV exceeding the withstand voltage of semiconductor element 1 may occur. This may cause deterioration of semiconductor element 1. It is therefore necessary to reduce the inductance.

The operation effects of the present embodiment will now be described.

In semiconductor package 100 according to the first embodiment, as shown in FIG. 1, second layer section 81 of second wiring layer 8 has a portion overlying first layer section 61 of first wiring layer 6 with second insulating layer 7 interposed. With this configuration, the direction of current flowing through first layer section 61 of first wiring layer 6 can be opposite to the direction of current flowing through the portion of second layer section 81 overlying first layer section 61 of first wiring layer 6 with second insulating layer 7 interposed. Thus, the temporal change of current flowing through first layer section 61 of first wiring layer 6 and the temporal change of current flowing through the portion of second layer section 81 of second wiring layer 8 overlying first layer section 61 with second insulating layer 7 interposed have opposite signs. The magnetic fluxes caused by the time rate of change di/dt of current cancel out. Thus, the wiring inductance due to a commutation loop flowing through first layer section 61 and second layer section 81 can be reduced. In the present embodiment, the commutation loop is current produced when semiconductor element 1 performs switching operation. Accordingly, the inductance of semiconductor package 100 can be reduced.

Since the inductance of semiconductor package 100 can be reduced, occurrence of a surge voltage exceeding the withstand voltage of semiconductor element 1 can be suppressed. Accordingly, deterioration of semiconductor element 1 can be suppressed.

As shown in FIG. 1, first layer section 61 of first wiring layer 6 covers first insulating layer 5. In this configuration, protrusion of first wiring layer 6 along the in-plane direction of first insulating layer 5 can be suppressed. Accordingly, semiconductor package 100 can be reduced in size.

Figure 6:
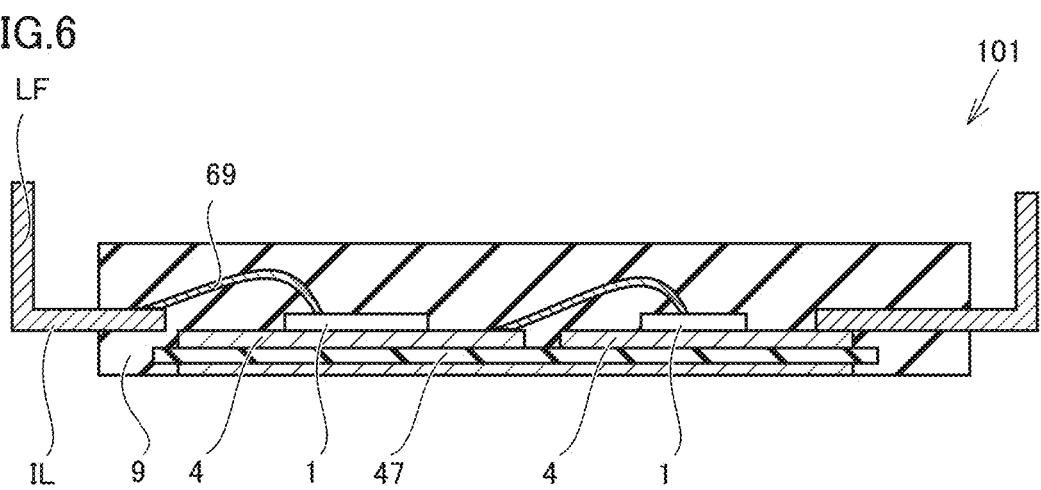
FIG. 6 is a cross-sectional view schematically showing a configuration of a semiconductor package according to a first comparative example.
Figure 7:
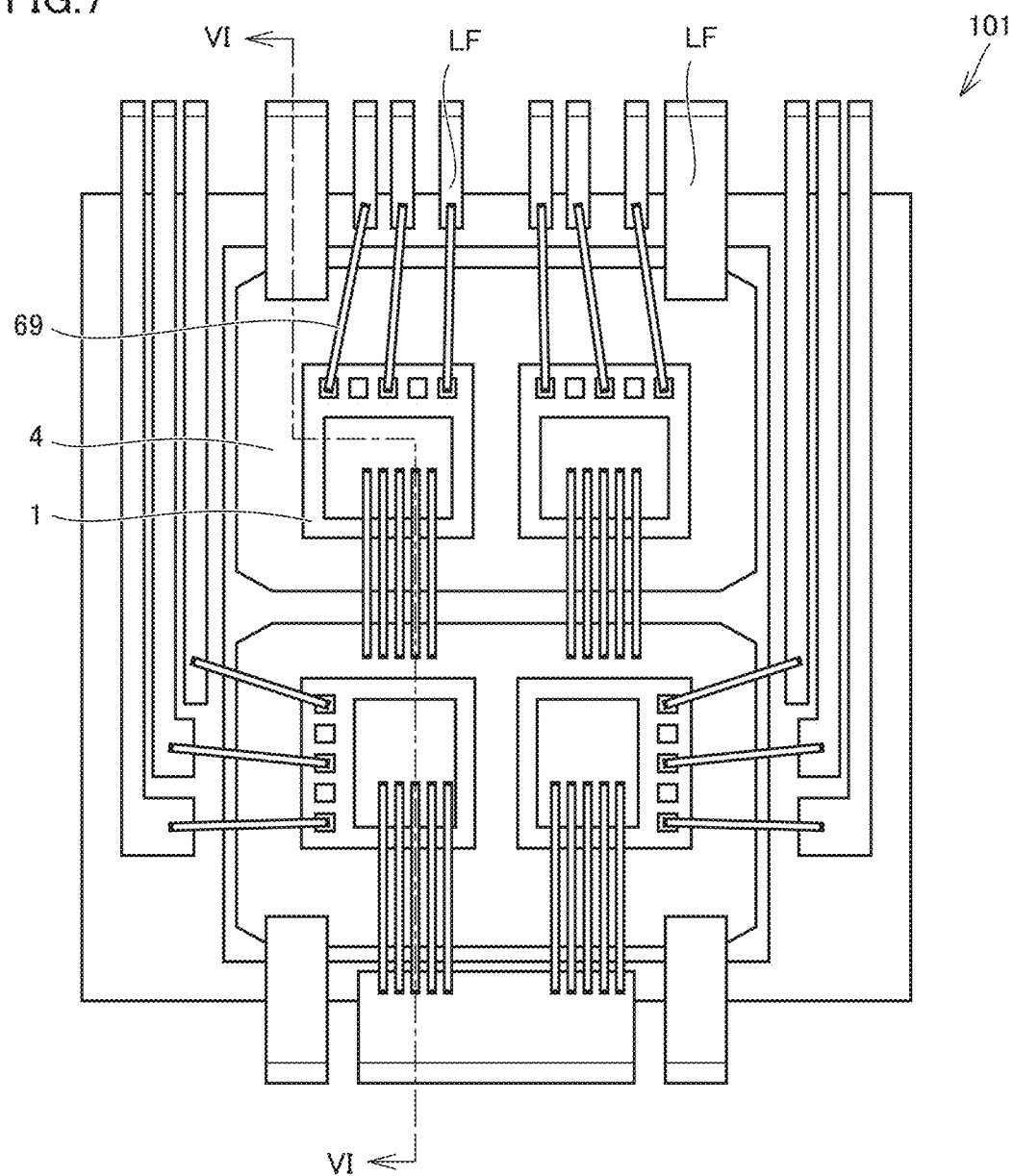
FIG. 7 is a top view schematically showing a configuration of the semiconductor package according to the first comparative example.

The operation effects of semiconductor package 100 according to the present embodiment will be described in detail in comparison with a semiconductor package 101 according to a first comparative example shown in FIG. 6 and FIG. 7. FIG. 6 is a cross-sectional view taken along line VI-VI in FIG. 7. As shown in FIG. 6 and FIG. 7, in semiconductor package 101 according to the first comparative example, semiconductor element 1 is connected to an insulating substrate 47 through solder. A lead frame LF is used as a connection terminal to external wiring. Lead frame LF and semiconductor element 1 are connected by, for example, a bonding wire 69. Bonding wire 69 is formed of, for example, copper (Cu) or aluminum (Al). Lead frame LF is typically manufactured by punching a metal plate of copper (Cu), iron (Fe), or the like. Thus, an inner lead IL serving as a bonding section to bonding wire 69 in lead frame LF is arranged on the same plane. Inner lead IL protrudes from the outer periphery of insulating substrate 47. Accordingly, lead frame LF increases the dimension of semiconductor package 100 along the in-plane direction of insulating substrate 47. In comparison, according to the present embodiment, since first layer section 61 of first wiring layer 6 covers first insulating layer 5, semiconductor package 100 can be reduced in size along the in-plane direction of first insulating layer 5.

As shown in FIG. 4 and FIG. 5, first wiring layer 6 and second wiring layer 8 each have an area equal to or larger than that of semiconductor element 1. In this configuration, permissible current (capacity) of first wiring layer 6 and second wiring layer 8 is large. The permissible current of first wiring layer 6 and second wiring layer 8 is larger than, for example, when first wiring layer 6 and second wiring layer 8 are thin lines. Accordingly, large current can be applied to semiconductor element 1 through first wiring layer 6 and second wiring layer 8.

As shown in FIG. 1, organic layer OL overlies second wiring layer 8. This configuration can suppress occurrence of discharge due to foreign substances adhering to second wiring layer 8. Furthermore, when external wiring is bonded to first wiring layer 6 by solder, flowing of the solder on second wiring layer 8 can be suppressed. In other words, organic layer OL can be used as solder resist. Furthermore, for example, compared with when first wiring layer 6, second wiring layer 8, and semiconductor element 1 are arranged in the interior space of a not-shown case and the interior space is sealed by silicone gel or the like, semiconductor package 100 can be insulated while semiconductor package 100 is reduced in size.

As shown in FIG. 1, first wiring portion 6a and second wiring portion 6b are connected by semiconductor element 1, conductive plate 2, and heat spreader 4. With this configuration, even when semiconductor element 1 is a vertical semiconductor element, current can be fed to semiconductor element 1 by first wiring portion 6a and second wiring portion 6b.

As shown in FIG. 1, sealing section 9 seals semiconductor element 1 and conductive plate 2 between first surface 41 and first insulating layer 5. With this configuration, the side surfaces of semiconductor element 1 and conductive plate 2 can be insulated.

As shown in FIG. 1, first insulating layer 5 and second insulating layer 7 are polymer films. With this configuration, the insulation properties of semiconductor package 100 can be enhanced, compared with when an insulating layer of a glass epoxy substrate is used. Furthermore, semiconductor package 100 can be made thin, compared with when an insulating layer of a glass epoxy substrate is used. With this configuration, the thickness of semiconductor package 100 can be reduced. Although not shown in the drawings, for example, even when semiconductor package 100 includes a third insulating film and a third wiring layer, the thickness of semiconductor package 100 can be reduced. Accordingly, semiconductor package 100 can be reduced in size. Furthermore, semiconductor package 100 can be reduced in weight.

Second Embodiment

Figure 8:
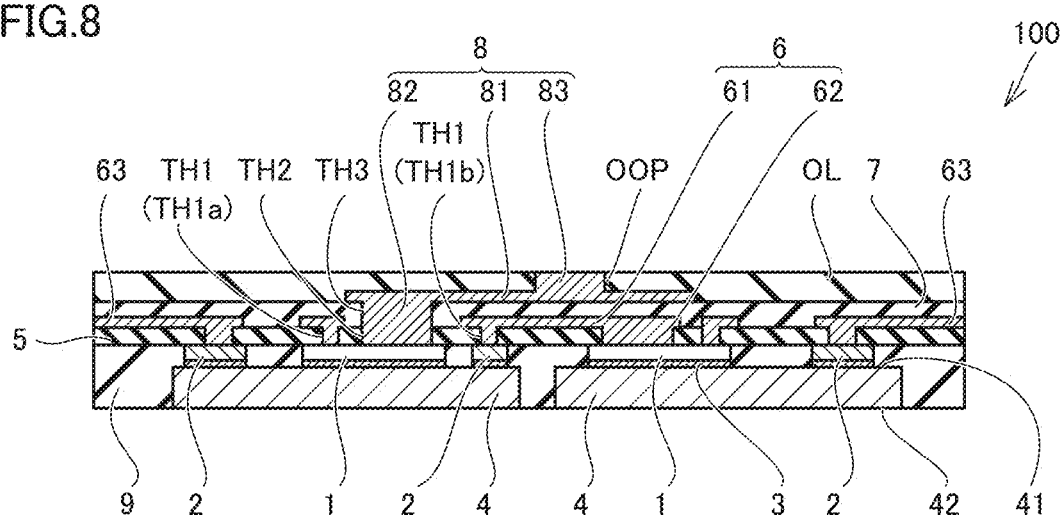
FIG. 8 is a cross-sectional view schematically showing a configuration of a semiconductor package according to a second embodiment.

Referring now to FIG. 8, a configuration of semiconductor package 100 according to a second embodiment will be described. The second embodiment has the same configuration and operation effects as those of the first embodiment unless otherwise specified. Therefore, the same configuration as the foregoing first embodiment is denoted by the same reference sign and a description thereof will not be repeated.

As shown in FIG. 8, in semiconductor package 100 according to the present embodiment, organic layer OL has an organic layer-side through hole OOP. Organic layer-side through hole OOP penetrates organic layer OL. Second terminal section 83 of second wiring layer 8 is arranged inside organic layer-side through hole OOP. Second terminal section 83 is exposed from organic layer-side through hole OOP.

Semiconductor package 100 according to the present embodiment differs from semiconductor package 100 according to the first embodiment in that the location where first wiring layer 6 and second wiring layer 8 are exposed is not on the outer periphery of second insulating layer 7.

The operation effects of the present embodiment will now be described.

In semiconductor package 100 according to the second embodiment, as shown in FIG. 8, second terminal section 83 is exposed from organic layer-side through hole OOP. With this configuration, an external connection terminal can be arranged on the front surface side of organic layer OL. Accordingly, the degree of freedom in design of semiconductor package 100 is improved.

Third Embodiment

Figure 9:
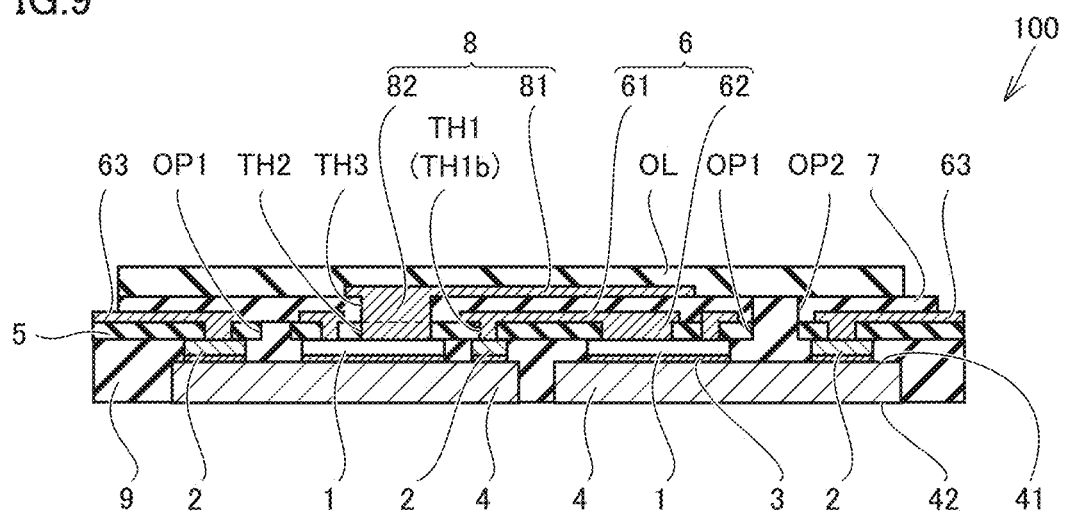
FIG. 9 is a cross-sectional view schematically showing a configuration of a semiconductor package according to a third embodiment.

Referring now to FIG. 9, a configuration of semiconductor package 100 according to a third embodiment will be described. The third embodiment has the same configuration and operation effects as those of the first embodiment unless otherwise specified. Therefore, the same configuration as the foregoing first embodiment is denoted by the same reference sign and a description thereof will not be repeated.

As shown in FIG. 9, in semiconductor package 100 according to the third embodiment, first insulating layer 5 has a first opening OP1. First opening OP1 penetrates first insulating layer 5. First opening OP1 is spaced apart from semiconductor element 1 and conductive plate 2. Sealing section 9 fills first opening OP1. Thus, sealing section 9 is fitted in first insulating layer 5. Although not shown in the drawing, when a resin adhesive layer is arranged between first insulating layer 5, and semiconductor element 1 and conductive plate 2, first opening OP1 penetrates the resin adhesive layer.

Second insulating layer 7 has a second opening OP2. Second opening OP2 penetrates second insulating layer 7. Second opening OP2 is communicatively connected to first opening OP1. Sealing section 9 fills first opening OP1 and second opening OP2. Thus, sealing section 9 is fitted in first insulating layer 5 and second insulating layer 7. Although not shown in the drawing, when a resin adhesive layer is arranged between second insulating layer 7, and first insulating layer 5 and second wiring layer 8, second opening OP2 penetrates the resin adhesive layer.

The operation effects of the present embodiment will now be described.

In semiconductor package 100 according to the third embodiment, as shown in FIG. 9, sealing section 9 fills first opening OP1. With this configuration, first insulating layer 5 and sealing section 9 can be securely bonded. Accordingly, separation between first insulating layer 5 and sealing section 9 can be suppressed. As shown in FIG. 9, sealing section 9 fills first opening OP1 and second opening OP2. With this configuration, second insulating layer 7 and sealing section 9 can be securely bonded. Accordingly, separation between second insulating layer 7 and sealing section 9 can be suppressed.

Fourth Embodiment

Figure 10:
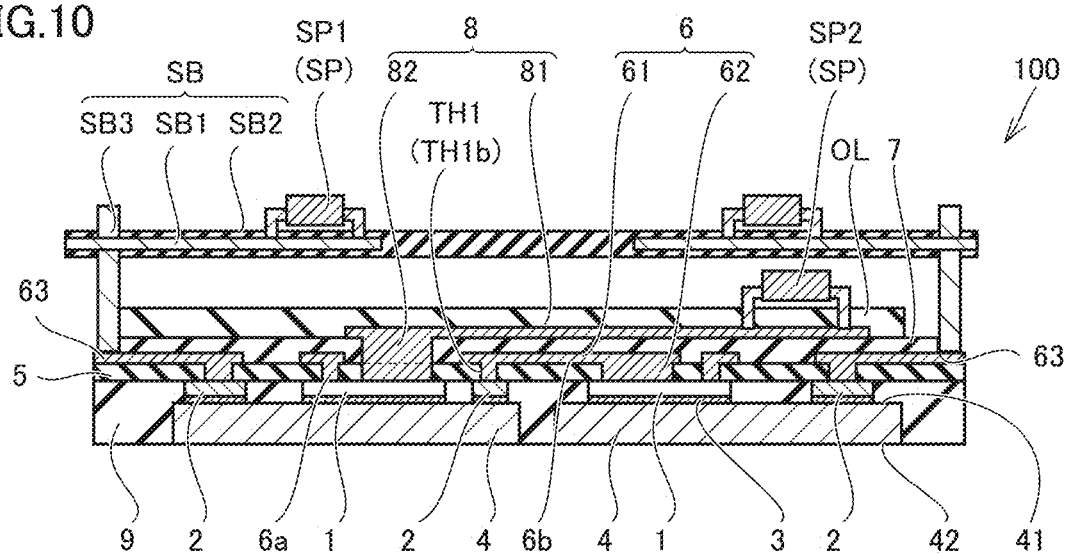
FIG. 10 is a cross-sectional view schematically showing a configuration of a semiconductor package according to a fourth embodiment.

Referring now to FIG. 10, a configuration of semiconductor package 100 according to a fourth embodiment will be described. The fourth embodiment has the same configuration and operation effects as those of the first embodiment unless otherwise specified. Therefore, the same configuration as the foregoing first embodiment is denoted by the same reference sign and a description thereof will not be repeated.

As shown in FIG. 10, semiconductor package 100 according to the fourth embodiment further includes a control board SB and a control component SP. Control board SB is electrically connected to first wiring layer 6. Control component SP includes a first control member SP1 and a second control member SP2. In FIG. 10, control component SP includes two first control members SP1 and a second control member SP2. First control members SP1 are mounted on control board SB. Second control member SP2 is mounted on organic layer OL. Second control member SP2 is electrically connected to second wiring layer 8. Second control member SP2 penetrates organic layer OL and is connected to second wiring layer 8.

Control board SB includes a wiring section SB1, a substrate section SB2, and a connection section SB3. First control member SP1 is electrically connected to wiring section SB1. Wiring section SB1 is electrically connected to first wiring layer 6 by connection section SB3.

The operation effects of the present embodiment will now be described.

In semiconductor package 100 according to the fourth embodiment, as shown in FIG. 10, second control member SP2 of control component SP is mounted on organic layer OL. Second control member SP2 is electrically connected to second wiring layer 8. With this configuration, a part of second wiring layer 8 can be used as a part of a control circuit. Thus, the area of control board SB can be reduced. Accordingly, semiconductor device 200 can be reduced in size.

Figure 11:
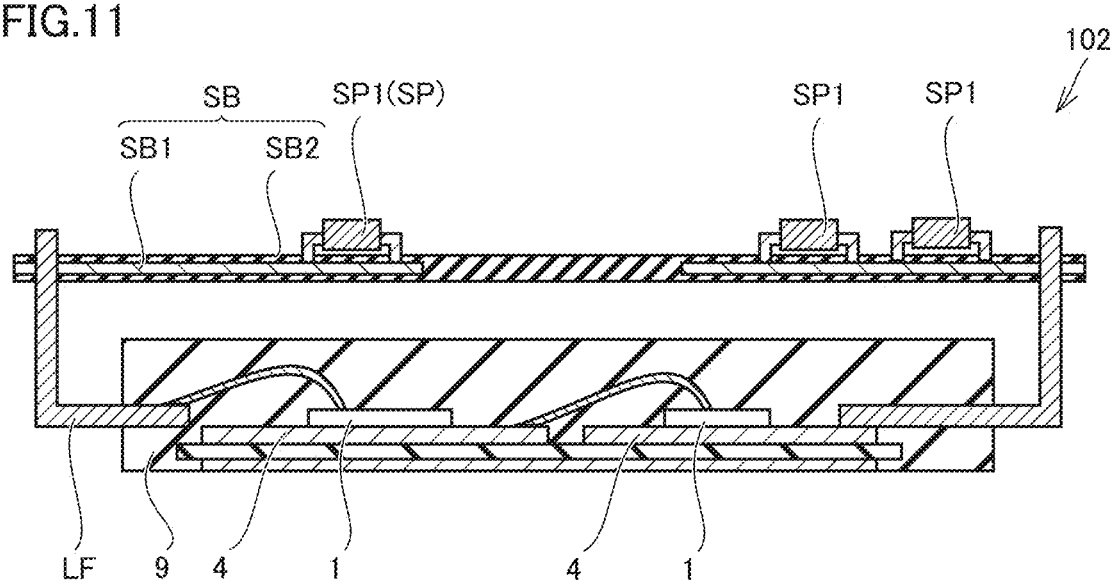
FIG. 11 is a cross-sectional view schematically showing a configuration of a semiconductor package according to a second comparative example.

The operation effects of semiconductor package 100 according to the present embodiment will be described in detail in comparison with a semiconductor package 102 according to a second comparative example shown in FIG. 11. As shown in FIG. 11, in semiconductor package 102 according to the second comparative example, control component SP is mounted on a surface of control board SB. Three first control members SP1 of the control member are mounted on control board SB. Thus, control board SB has an area in which three first control members SP1 can be mounted.

In comparison, in semiconductor package 100 according to the present embodiment, since second control member SP2 is mounted on organic layer OL, control board SB only needs to have an area in which two first control members SP1 can be mounted. Accordingly, the area of control board SB can be reduced.

Fifth Embodiment

Figure 12:
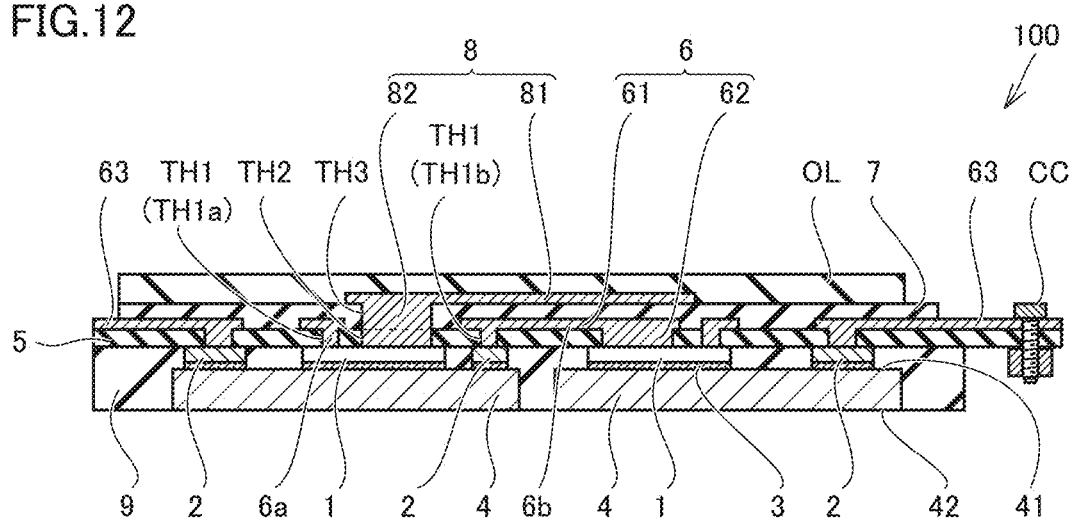
FIG. 12 is a cross-sectional view schematically showing a configuration of a semiconductor package according to a fifth embodiment.

Referring now to FIG. 12, a configuration of semiconductor package 100 according to a fifth embodiment will be described. The fifth embodiment has the same configuration and operation effects as those of the first embodiment unless otherwise specified. Therefore, the same configuration as the foregoing first embodiment is denoted by the same reference sign and a description thereof will not be repeated.

As shown in FIG. 12, in semiconductor package 100 according to the fifth embodiment, first wiring layer 6 extends to the outside of the outer periphery of sealing section 9. Specifically, first terminal section 63 of first wiring layer 6 extends to the outside of the outer periphery of sealing section 9. First insulating layer 5 extends to the outside of the outer periphery of sealing section 9. Semiconductor package 100 further includes a connection member CC. Connection member CC is fixed to first insulating layer 5 and first terminal section 63. Connection member CC penetrates first insulating layer 5 and first terminal section 63. Connection member CC is, for example, a bolt and a nut.

The operation effects of the present embodiment will now be described.

In semiconductor package 100 according to the fifth embodiment, as shown in FIG. 12, first wiring layer 6 extends to the outside of the outer periphery of sealing section 9. With this configuration, connection member CC can be fixed to first wiring layer 6. Thus, first wiring layer 6 can be connected to external wiring by connection member CC. Accordingly, semiconductor package 100 can be connected to external wiring more easily than when external wiring is directly connected to first wiring layer 6 or second wiring layer 8 by soldering. Furthermore, semiconductor package 100 can be connected to external wiring more easily than when external wiring is connected to a socket soldered to first wiring layer 6 or second wiring layer 8.

Sixth Embodiment

Figure 13:
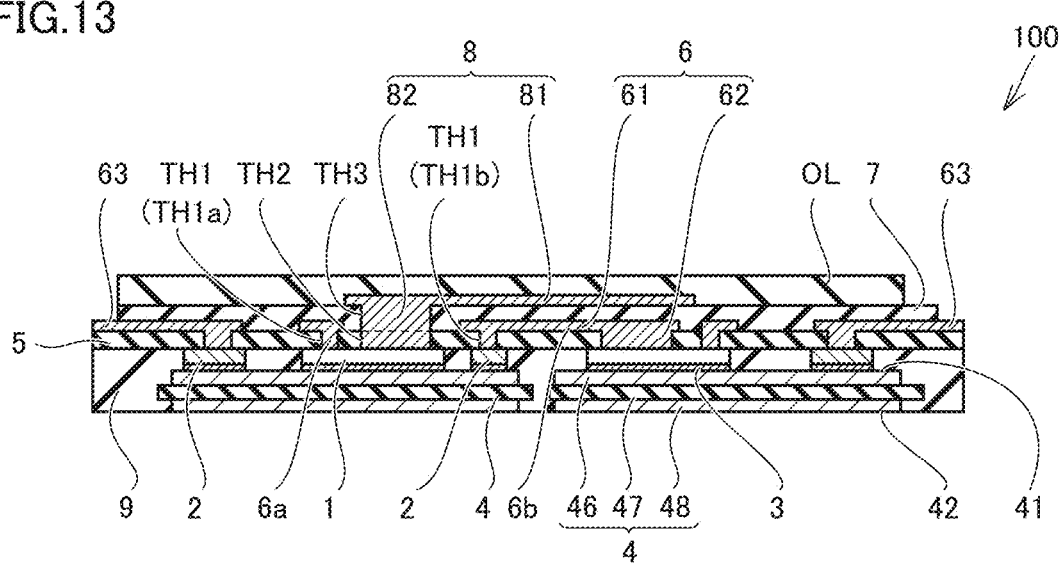
FIG. 13 is a cross-sectional view schematically showing a configuration of a semiconductor package according to a sixth embodiment.

Referring now to FIG. 13, a configuration of semiconductor package 100 according to a sixth embodiment will be described. The sixth embodiment has the same configuration and operation effects as those of the first embodiment unless otherwise specified. Therefore, the same configuration as the foregoing first embodiment is denoted by the same reference sign and a description thereof will not be repeated.

As shown in FIG. 13, in semiconductor package 100 according to the sixth embodiment, heat spreader 4 includes a first metal plate 46, an insulating substrate 47, and a second metal plate 48. Semiconductor element 1 and conductive plate 2 are electrically connected to first metal plate 46. Insulating substrate 47 is sandwiched between second metal plate 48 and first metal plate 46. Insulating substrate 47 is affixed to first metal plate 46 and second metal plate 48.

The material of first metal plate 46 and second metal plate 48 is, for example, a metal having high conductivity, such as copper (Cu) and aluminum (Al). Insulating substrate 47 is, for example, a ceramic plate. Insulating substrate 47 has a higher thermal conductivity than a resin insulating layer RL described later (see FIG. 14). The operation effects of the present embodiment will now be described.

In semiconductor package 100 according to the sixth embodiment, as shown in FIG. 13, the insulating plate is sandwiched between second metal plate 48 and first metal plate 46. In this configuration, first metal plate 46 and second metal plate 48 are insulated by insulating substrate 47. Thus, when a heat sink HS described later (see FIG. 14) is bonded to semiconductor package 100, semiconductor element 1 and heat sink HS (see FIG. 14) can be insulated by insulating substrate 47. Thus, it is not necessary to arrange an insulating layer between heat spreader 4 and heat sink HS (see FIG.

14). Furthermore, second metal plate 48 of heat spreader 4 and heat sink HS (see FIG. 14) can be bonded, for example, by solder having a high thermal conductivity. Accordingly, the heat dissipation of semiconductor package 100 is improved.

Seventh Embodiment

Figure 14:
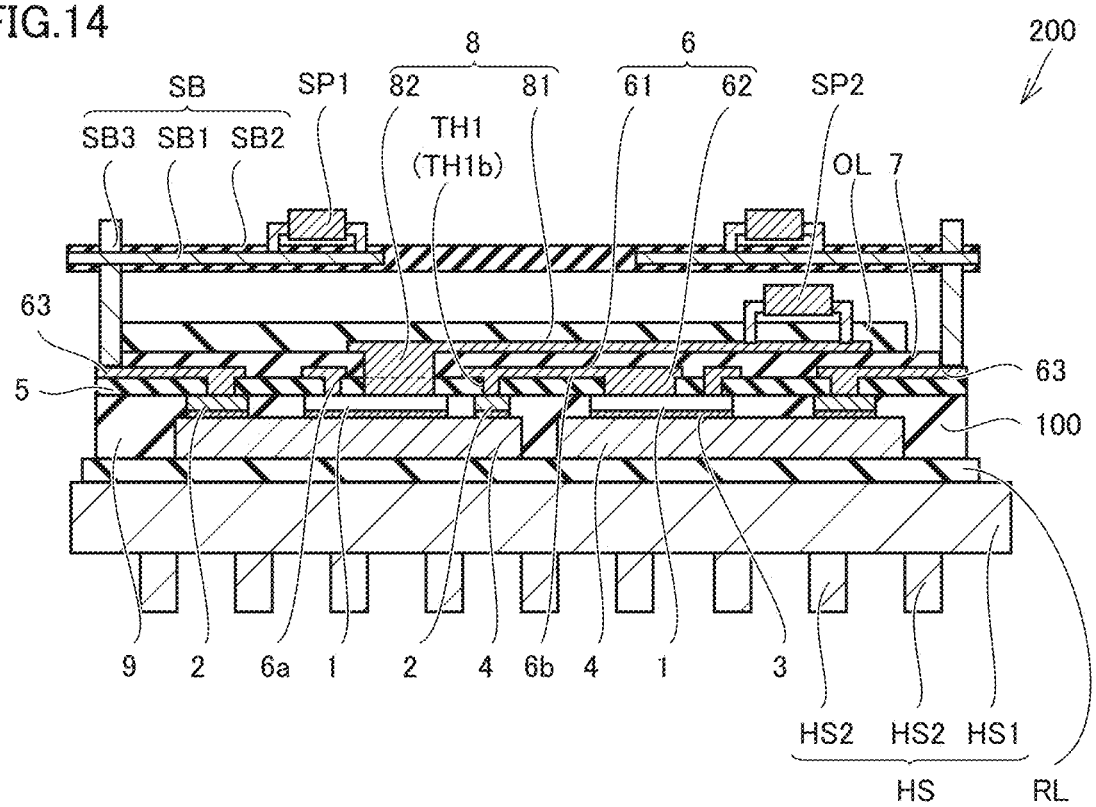
FIG. 14 is a cross-sectional view schematically showing a configuration of a semiconductor device according to a seventh embodiment.

Referring now to FIG. 14, a configuration of semiconductor package 100 and a semiconductor device 200 according to a seventh embodiment will be described. The seventh embodiment has the same configuration and operation effects as those of the fourth embodiment unless otherwise specified. Therefore, the same configuration as the foregoing fourth embodiment is denoted by the same reference sign and a description thereof will not be repeated.

As shown in FIG. 14, semiconductor device 200 according to the seventh embodiment includes semiconductor package 100 described in the first to sixth embodiments, a heat sink HS, and a resin insulating layer RL. Resin insulating layer RL is sandwiched between heat sink HS and heat spreader 4. Thus, the semiconductor package is bonded to heat sink HS by resin insulating layer RL. In FIG. 14, semiconductor device 200 includes semiconductor package 100 described in the fourth embodiment. Semiconductor package 100 is attached to heat sink HS by resin insulating layer RL. Semiconductor package 100 is insulated from heat sink HS by resin insulating layer RL.

Heat sink HS includes a base HS1 and a plurality of fins HS2. Base HS1 is bonded to heat spreader 4. Base HS1 is sandwiched between a plurality of fins HS2 and heat spreader 4.

Figure 15:
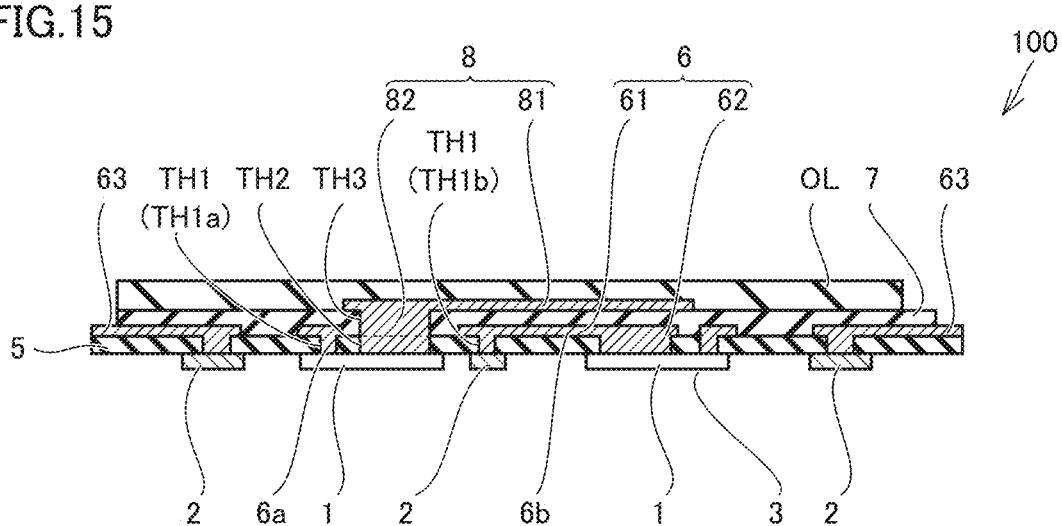
FIG. 15 is a cross-sectional view schematically showing a state in which a first insulating layer, a first wiring layer, a second insulating layer, a second wiring layer, and an organic layer are stacked in a semiconductor package of the semiconductor device according to the seventh embodiment.
Figure 16:
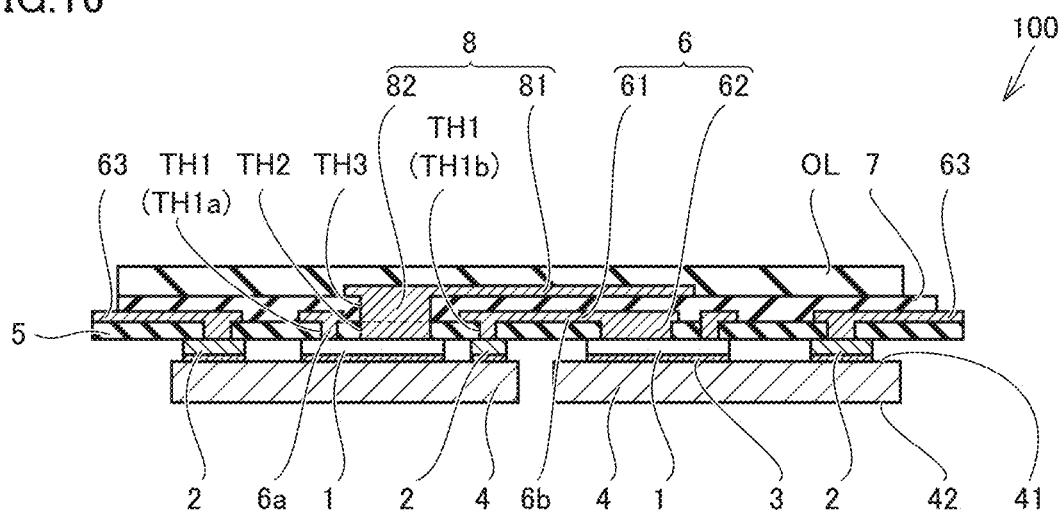
FIG. 16 is a cross-sectional view schematically showing a state in which a semiconductor element and a conductive plate are bonded to a heat spreader in the semiconductor package of the semiconductor device according to the seventh embodiment.

Referring now to FIG. 14 to FIG. 16, a method of manufacturing semiconductor device 200 according to the seventh embodiment will be described.

As shown in FIG. 15, first insulating layer 5 is arranged so as to cover semiconductor element 1 and conductive plate 2, and then first wiring layer 6, second insulating layer 7, second wiring layer 8, and organic layer OL are overlaid. Subsequently, as shown in FIG. 16, semiconductor element 1 and conductive plate 2 are bonded to heat spreader 4 by bonding material 3. Subsequently, as shown in FIG. 14, semiconductor element 1, conductive plate 2, and heat spreader 4 are sealed by sealing section 9, and then heat spreader 4 is attached to heat sink HS by resin insulating layer RL.

The operation effects of the present embodiment will now be described.

In semiconductor device 200 according to the seventh embodiment, as shown in FIG. 14, resin insulating layer RL is sandwiched between heat sink HS and heat spreader 4. With this configuration, heat produced from semiconductor element 1 of semiconductor package 100 is transmitted to heat sink HS through heat spreader 4 and resin insulating layer RL. Thus, heat produced from semiconductor element 1 is dissipated from heat sink HS. Accordingly, the heat dissipation of semiconductor device 200 is improved.

Eighth Embodiment

Figure 17:
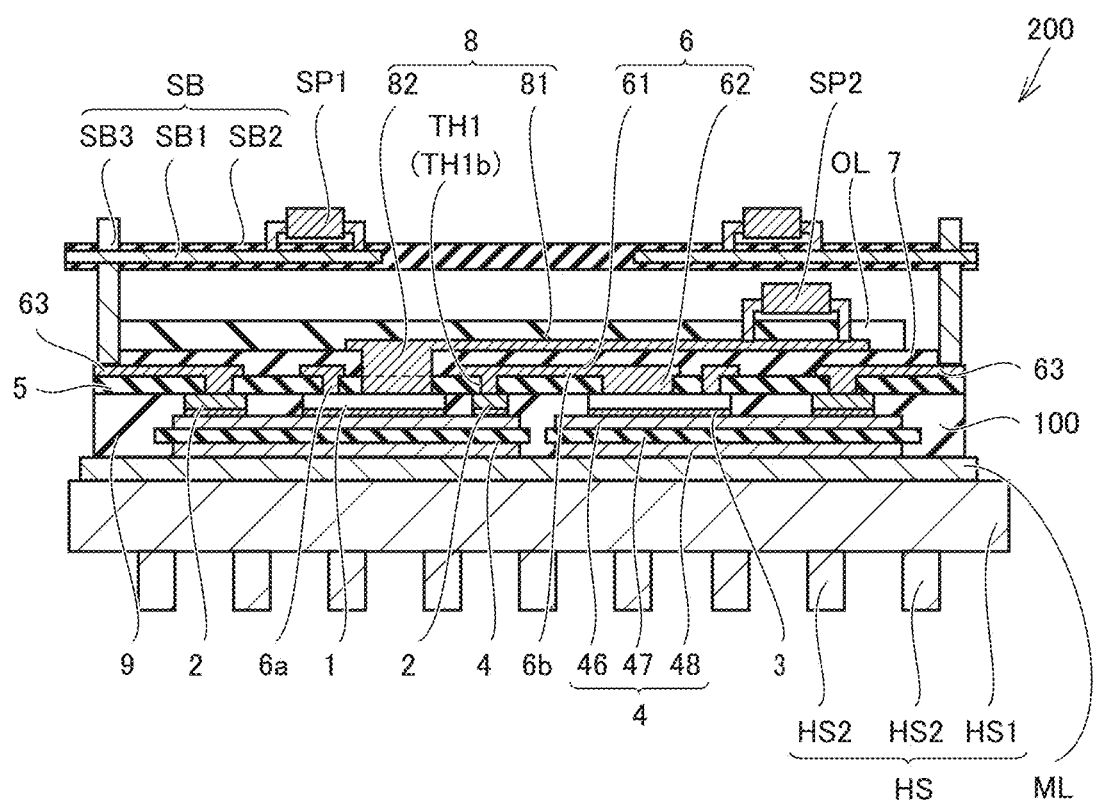
FIG. 17 is a cross-sectional view schematically showing a configuration of a semiconductor device according to an eighth embodiment.

Referring now to FIG. 17, a configuration of semiconductor device 200 according to an eighth embodiment will be described. The eighth embodiment has the same configuration and operation effects as those of the sixth embodiment unless otherwise specified. Therefore, the same configuration as the foregoing sixth embodiment is denoted by the same reference sign and a description thereof will not be repeated.

As shown in FIG. 17, semiconductor device 200 according to the eighth embodiment includes semiconductor package 100 described in the sixth embodiment, heat sink HS, and a conductive metal bonding material ML. Conductive metal bonding material ML is sandwiched between heat sink HS and second metal plate 48 of heat spreader 4. Thus, semiconductor package 100 is bonded to heat sink HS by conductive metal bonding material ML. Conductive metal bonding material ML includes, for example, solder, silver (Ag), and copper (Cu). Conductive metal bonding material ML has conductivity. Conductive metal bonding material ML has a higher electrical conductivity than resin insulating layer RL (see FIG. 14). Conductive metal bonding material ML has a higher thermal conductivity than resin insulating layer RL (see FIG. 14).

The operation effects of the present embodiment will now be described.

In semiconductor device 200 according to the eighth embodiment, as shown in FIG. 17, conductive metal bonding material ML is sandwiched between heat sink HS and second metal plate 48 of heat spreader 4. With this configuration, heat produced from semiconductor element 1 of semiconductor package 100 is transmitted to heat sink HS through heat spreader 4 and conductive metal bonding material ML. Thus, heat produced from semiconductor element 1 is dissipated from heat sink HS. Accordingly, the heat dissipation of semiconductor device 200 is improved. Conductive metal bonding material ML has a higher thermal conductivity than resin insulating layer RL (see FIG. 14). With this configuration, the heat dissipation of semiconductor device 200 is improved, compared with when heat spreader 4 and heat sink HS are bonded by resin insulating layer RL.

Ninth Embodiment

Figure 18:
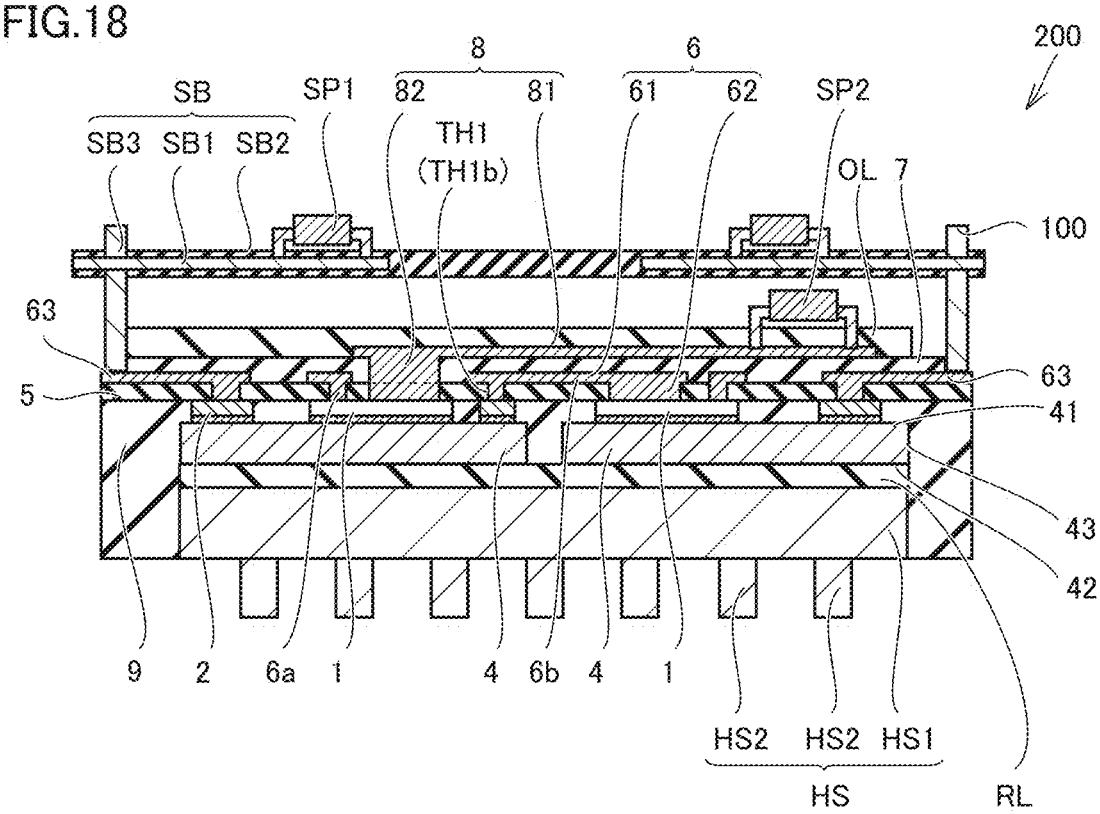
FIG. 18 is a cross-sectional view schematically showing a configuration of a semiconductor device according to a ninth embodiment.

Referring now to FIG. 18, a configuration of semiconductor device 200 according to a ninth embodiment will be described. The ninth embodiment has the same configuration and operation effects as those of the fourth embodiment unless otherwise specified. Therefore, the same configuration as the foregoing fourth embodiment is denoted by the same reference sign and a description thereof will not be repeated.

Figure 19:
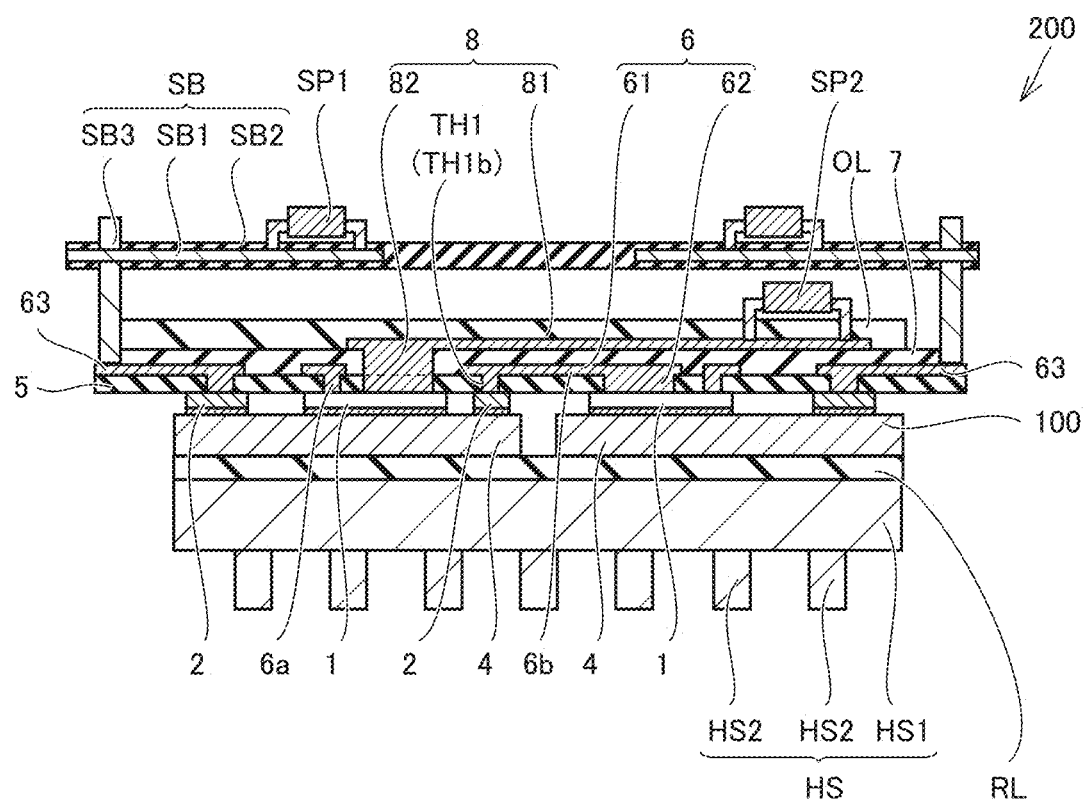
FIG. 19 is a cross-sectional view schematically showing a state in which a semiconductor package and a heat sink are bonded in the semiconductor device according to the ninth embodiment.

As shown in FIG. 18 and FIG. 19, semiconductor device 200 according to the ninth embodiment includes semiconductor package 100 described in the first to sixth embodiments and heat sink HS. Heat sink HS is bonded to heat spreader 4 on a side opposite to semiconductor element 1 with respect to heat spreader 4. Heat spreader 4 and heat sink HS are sealed by sealing section 9. Thus, heat spreader 4 and heat sink HS are collectively sealed. Sealing section 9 seals first surface 41 and side surface 43 of heat spreader 4.

In the present embodiment, heat spreader 4 and heat sink HS are bonded before heat spreader 4 and heat sink HS are sealed by sealing section 9. Thus, heat spreader 4 and heat sink HS are sealed by transfer molding using a mold, with resin insulating layer RL sandwiched between heat spreader 4 and heat sink HS. As shown in FIG. 19, heat spreader 4 and heat sink HS may be bonded by resin insulating layer RL in advance. Instead of resin insulating layer RL, heat spreader 4 and heat sink HS may be bonded by an insulating substrate of ceramics or the like and thereby integrated. The operation effects of the present embodiment will now be described.

In semiconductor device 200 according to the ninth embodiment, as shown in FIG. 18, heat spreader 4 and heat sink HS are sealed by sealing section 9. With this configuration, heat spreader 4 and heat sink HS can be sealed simultaneously by sealing section 9. As shown in FIG. 14 to FIG. 16, therefore, it is not necessary to bond heat sink HS to heat spreader 4 after heat spreader 4 is sealed by sealing section 9. The manufacturing steps of semiconductor device 200 therefore can be simplified.

Tenth Embodiment

In the present embodiment, the semiconductor device according to the foregoing seventh to ninth embodiment is applied to a power conversion device. Although the present disclosure is not limited to a specific power conversion device, a case in which the present disclosure is applied to a three-phase inverter will be described as the tenth embodiment.

Figure 20:
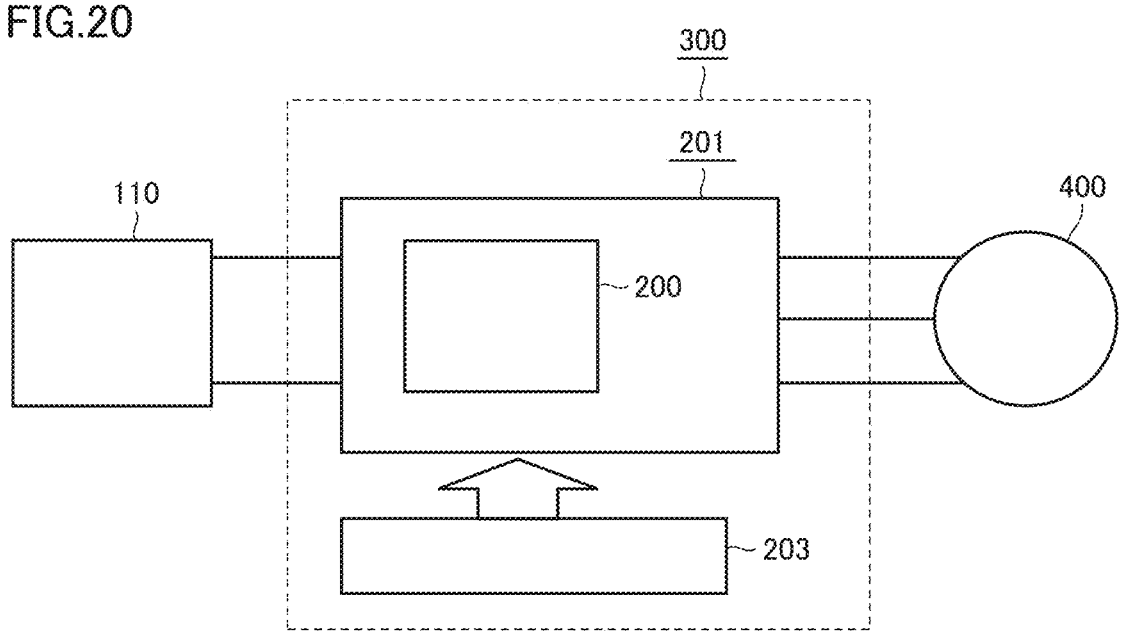
FIG. 20 is a block diagram schematically showing a configuration of a power conversion device according to a tenth embodiment.

FIG. 20 is a block diagram showing a configuration of a power conversion system to which the power conversion device according to the present embodiment is applied.

The power conversion system shown in FIG. 20 includes a power source 110, a power conversion device 300, and a load 400. Power source 110 is a DC power source and supplies DC power to power conversion device 300. Power source 110 can be configured with a variety of power sources, such as a DC system, solar cells, a storage battery, and may be configured with a rectifier circuit or an AC/DC converter connected to an AC system. Power source 110 may be configured with a DC/DC converter that converts DC power output from a DC system into a predetermined power.

Power conversion device 300 is a three-phase inverter connected between power source 110 and load 400, and converts a DC power supplied from power source 110 into an AC power and supplies the AC power to load 400. As shown in FIG. 20, power conversion device 300 includes a main conversion circuit 201 to convert a DC power into an AC power and output the AC power, and a control circuit 203 to output a control signal for controlling main conversion circuit 201 to main conversion circuit 201.

Load 400 is a three-phase motor driven by the AC power supplied from power conversion device 300. Load 400 is not limited to specific applications and is a motor mounted on a variety of electrical equipment and used as a motor for, for example, a hybrid car, an electric car, a railroad vehicle, an elevator, or an air conditioner.

The detail of power conversion device 300 will be described below. Main conversion circuit 201 includes switching elements and freewheeling diodes (not shown), and the switching elements perform switching to convert a DC power supplied from power source 110 into an AC power and supply the AC power to load 400. Main conversion circuit 201 may have a variety of specific circuit configurations. Main conversion circuit 201 according to the present embodiment may be a two-level three-phase full-bridge circuit and may include six switching elements and six freewheeling diodes connected in anti-parallel with the respective switching elements. At least any one of the switching elements and the freewheeling diodes of main conversion circuit 201 is a switching element or a freewheeling diode of semiconductor device 200 corresponding to the semiconductor device according to any one of the foregoing seventh to ninth embodiments. Six switching elements are connected in series two by two to form upper and lower arms, and the upper and lower arms configure each phase (U phase, V phase, W phase) of the full-bridge circuit. The output terminals of the upper and lower arms, that is, three output terminals of main conversion circuit 201 are connected to load 400.

Although main conversion circuit 201 includes a drive circuit (not shown) for driving each switching element, the drive circuit may be contained in semiconductor device 200 or a drive circuit may be provided separately from semiconductor device 200. The drive circuit generates a drive signal for driving a switching element of main conversion circuit 201 and supplies the drive signal to the control electrode of the switching element of main conversion circuit 201. Specifically, a drive signal for turning on a switching element and a drive signal for turning off a switching element are output to the control electrode of each switching element, in accordance with a control signal from control circuit 203 described later. When the switching element is kept on, the drive signal is a voltage signal (ON signal) equal to or higher a threshold voltage of the switching element, and when a switching element is kept off, the drive signal is a voltage signal (OFF signal) equal to or lower than a threshold voltage of the switching element.

Control circuit 203 controls the switching elements of main conversion circuit 201 so that a desired power is supplied to load 400. Specifically, the time (ON time) in which each switching element of main conversion circuit 201 is to be turned on is calculated based on a power to be supplied to load 400. For example, main conversion circuit 201 can be controlled by PWM control that modulates the ON time of the switching elements in accordance with a voltage to be output. Then, a control command (control signal) is output to the drive circuit of main conversion circuit 201 so that an ON signal is output to a switching element to be turned on and an OFF signal is output to a switching element to be turned off, at each point of time. The drive circuit outputs an ON signal or an OFF signal as a drive signal to the control electrode of each switching element, in accordance with the control signal.

In the power conversion device according to the present embodiment, reduction of inductance can be achieved, because the semiconductor device according to the seventh to ninth embodiments is applied as semiconductor device 200 that constitutes main conversion circuit 201.

In the present embodiment, the present disclosure is applied to a two-level three-phase inverter. However, the present disclosure is not limited thereto and can be applied to a variety of power conversion devices. In the present embodiment, the present disclosure is applied to a two-level power conversion device but may be applied to a three-level or multi-level power conversion device or may be applied to a single-phase inverter when power is supplied to a single-phase load. The present disclosure is applicable to a DC/DC converter or an AC/DC converter when power is supplied to a DC load or the like.

The power conversion device to which the present disclosure is applied is not limited to the case in which the load is a motor, and, for example, can be used as a power source device for electrical discharge machines, laser processing machines, or induction heating cookers or wireless charging systems, or can be used as a power conditioner for solar power generation systems and power storage systems. Embodiments disclosed here should be understood as being illustrative rather than being limitative in all respects. The scope of the present disclosure is shown not in the foregoing description but in the claims, and it is intended that all modifications that come within the meaning and range of equivalence to the claims are embraced here.

REFERENCE SIGNS LIST 1 semiconductor element, 2 conductive plate, 3 bonding material, 4 heat spreader, 5 first insulating layer, 6 first wiring layer, 7 second insulating layer, 8 second wiring layer, 9 sealing section, 46 first metal plate, 47 insulating substrate, 48 second metal plate, 61 first layer section, 62 second layer section, 100 semiconductor package, 110 power source, 200 semiconductor device, 201 main conversion circuit, 203 control circuit, 300 power conversion device, 400 load, HS heat sink, ML conductive metal bonding material, OL organic layer, OP1 first opening, OP2 second opening, RL insulating resin layer, TH1 first through hole, TH1a first through portion, TH1b second through portion, TH2 second through hole, TH3 third through hole, SB control board, SP control component, SP1 first control member, SP2 second control member.

The invention claimed is:

1. A semiconductor package comprising:
a semiconductor element;
a first insulating layer covering the semiconductor element and having a first through hole and a second through hole;
a first wiring layer including a first layer section covering the first insulating layer, and electrically connected to the semiconductor element through the first through hole;
a second insulating layer covering the first insulating layer and the first wiring layer and having a third through hole communicatively connected to the second through hole; and
a second wiring layer including a second layer section covering the second insulating layer, and electrically connected to the semiconductor element through the second through hole and the third through hole, wherein
the second layer section of the second wiring layer has a portion overlying the first layer section of the first wiring layer with the second insulating layer interposed,
the first wiring layer includes a first terminal section,
the second wiring layer includes a second terminal section,
the first terminal section and the second terminal section each have an exposed portion on a side opposite to the semiconductor element with respect to the first insulating layer, and
a direction of current flowing through the first layer section of the first wiring layer is opposite to a direction of current flowing through the portion of the second layer section overlying the first layer section of the first wiring layer with the second insulating layer interposed.

2. The semiconductor package according to claim 1, wherein the first wiring layer and the second wiring layer each have an area equal to or larger than an area of the semiconductor element.

3. The semiconductor package according to claim 1, further comprising an organic layer overlying the second wiring layer,
wherein the first wiring layer and the second wiring layer are partially exposed from the organic layer.

4. The semiconductor package according to claim 1, further comprising:
a conductive plate; and
a heat spreader including a first surface, wherein
the semiconductor element and the conductive plate are bonded to the first surface,
the first wiring layer includes a first wiring portion and a second wiring portion,
the first through hole includes a first through portion overlapping the semiconductor element and a second through portion overlapping the conductive plate,
the first wiring portion is electrically connected to the semiconductor element through the first through portion,
the second wiring portion is electrically connected to the conductive plate through the second through portion, and
the first wiring portion and the second wiring portion are connected by the semiconductor element, the conductive plate, and the heat spreader.

5. The semiconductor package according to claim 4, wherein
the heat spreader includes a first metal plate to which the semiconductor element and the conductive plate are electrically connected, an insulating substrate, and a second metal plate, and
the insulating substrate is sandwiched between the second metal plate and the first metal plate.

6. A semiconductor device comprising:
the semiconductor package according to claim 5;
a heat sink; and
a conductive metal bonding material, wherein
the conductive metal bonding material is sandwiched between the heat sink and the second metal plate of the heat spreader.

7. The semiconductor package according to claim 4, further comprising a sealing section,
wherein the sealing section seals the semiconductor element and the conductive plate between the first surface and the first insulating layer.

8. The semiconductor package according to claim 7, wherein
the first insulating layer has a first opening penetrating the first insulating layer,
the first opening is spaced apart from the semiconductor element and the conductive plate, and
the sealing section fills the first opening.

9. The semiconductor package according to claim 8, wherein
the second insulating layer has a second opening penetrating the second insulating layer and communicatively connected to the first opening, and
the sealing section fills the first opening and the second opening.

10. The semiconductor package according to claim 7, wherein the first wiring layer extends to outside of an outer periphery of the sealing section.

11. A semiconductor device comprising:
the semiconductor package according to claim 7; and
a heat sink, wherein
the heat sink is bonded to the heat spreader on a side opposite to the semiconductor element with respect to the heat spreader, and
the heat spreader and the heat sink are sealed by the sealing section.

12. A semiconductor device comprising:
the semiconductor package according to claim 4;

a heat sink; and a resin insulating layer, wherein the resin insulating layer is sandwiched between the heat sink and the heat spreader.

13. A power conversion device comprising a main conversion circuit including the semiconductor device according to claim 12, the main conversion circuit converting input power and outputting the converted power; and a control circuit to output a control signal for controlling the main conversion circuit to the main conversion circuit.

14. A semiconductor package comprising:

a semiconductor element;

a first insulating layer covering the semiconductor element and having a first through hole and a second through hole;

a first wiring layer including a first layer section covering the first insulating layer, and electrically connected to the semiconductor element through the first through hole;

a second insulating layer covering the first insulating layer and the first wiring layer and having a third through hole communicatively connected to the second through hole;

a second wiring layer including a second layer section covering the second insulating layer, and electrically connected to the semiconductor element through the second through hole and the third through hole, the second layer section of the second wiring layer having a portion overlying the first layer section of the first wiring layer with the second insulating layer interposed;

an organic layer overlying the second wiring layer, the first wiring layer and the second wiring layer being partially exposed from the organic layer;

a control board electrically connected to the first wiring layer; and a control component, wherein the control component includes a first control member and a second control member, the first control member is mounted on the control board, the second control member is mounted on the organic layer and electrically connected to the second wiring layer, and a direction of current flowing through the first layer section of the first wiring layer is opposite to a direction of current flowing through the portion of the second layer section overlying the first layer section of the first wiring layer with the second insulating layer interposed.

* * * * *